United States Patent
Kuroda et al.

(10) Patent No.: US 8,081,779 B2
(45) Date of Patent: Dec. 20, 2011

(54) AUDIO CIRCUIT

(75) Inventors: Jun Kuroda, Tokyo (JP); Yukio Murata, Tokyo (JP); Ukyo Mori, Tokyo (JP); Satoshi Hosokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 716 days.

(21) Appl. No.: 12/280,208

(22) PCT Filed: Mar. 14, 2007

(86) PCT No.: PCT/JP2007/055098
§ 371 (c)(1),
(2), (4) Date: Aug. 21, 2008

(87) PCT Pub. No.: WO2007/119362
PCT Pub. Date: Oct. 25, 2007

(65) Prior Publication Data
US 2010/0226513 A1    Sep. 9, 2010

(30) Foreign Application Priority Data
Mar. 22, 2006   (JP) .................................. 2006-078461

(51) Int. Cl.
*H04R 3/00* (2006.01)
(52) U.S. Cl. ........................................ 381/116; 381/111
(58) Field of Classification Search ................... 381/116, 381/111
See application file for complete search history.

(56) References Cited

U.S. PATENT DOCUMENTS

| 4,517,415 A | 5/1985 | Laurence |
| 5,832,097 A | 11/1998 | Armstrong et al. |

FOREIGN PATENT DOCUMENTS

| JP | 59146296 A | 8/1984 |
| JP | 05234249 A | 9/1993 |
| JP | 2002198756 A | 7/2002 |
| JP | 2002369290 A | 12/2002 |
| JP | 2005109665 A | 4/2005 |
| WO | 2006020427 A2 | 2/2006 |

OTHER PUBLICATIONS

International Preliminary Report on Patentability for PCT/JP2007/055098 issued Oct. 21, 2008.
International Search Report for PCT/JP2007/055098 mailed Jun. 26, 2007.
Supplementary European Search Report for EP 07 73 8568 completed Sep. 21, 2011.

*Primary Examiner* — Douglas Menz (57) ABSTRACT

An object is to provide an audio circuit in which flow of excessive current through a capacitive speaker and a drive circuit thereof can be prevented while degradation of sound quality of high-pitched tones is suppressed. The audio circuit for driving a capacitive speaker includes: a weighting circuit for performing weighting in conformity with frequency components of an audio signal; and a signal-voltage limiting compression circuit for compressing a signal, which is input to the drive amplifier or which has been output from the drive circuit, at a prescribed compression ratio in accordance with a difference voltage between the output signal of the weighting circuit and a preset threshold voltage when the weighted signal exceeds the threshold voltage. Alternatively, the audio circuit is provided with a signal-voltage limiting compression circuit for passing, with amplitudes unchanged, signal components below a prescribed frequency contained in the signal reproduced by the capacitive speaker and compressing amplitudes of signal components not less than the prescribed frequency at a prescribed compression ratio.

18 Claims, 9 Drawing Sheets

AUDIO CIRCUIT

TECHNICAL FIELD

This invention relates to an audio circuit for driving a capacitive speaker that utilizes a piezoelectric transducer mechanism or electrostatic transducer mechanism.

BACKGROUND ART

Figure 11:
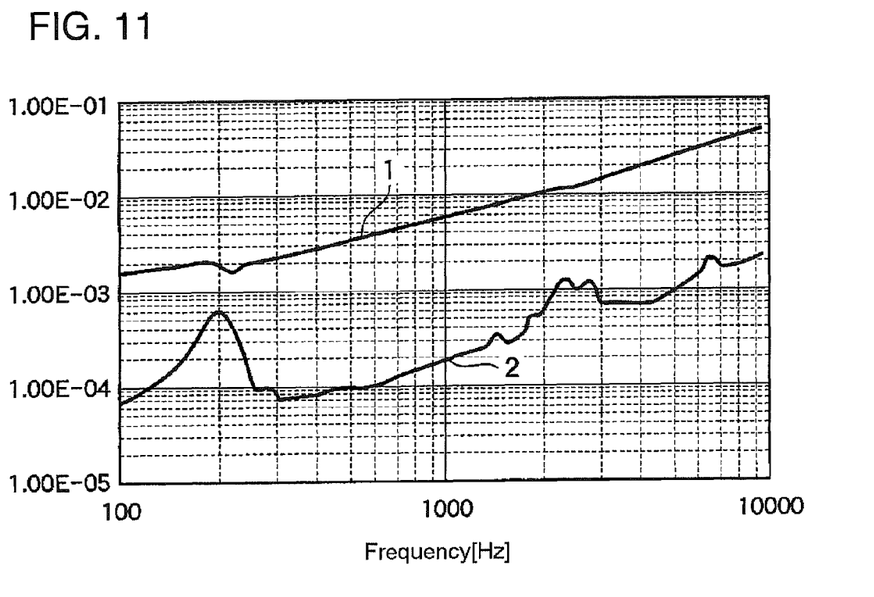
FIG. 11 is a graph illustrating an example of the frequency characteristics of conductance and susceptance of a capacitive speaker.

In a capacitive speaker that utilizes a piezoelectric transducer mechanism or electrostatic transducer mechanism, e.g., a piezoelectric speaker, a condenser speaker or a flat-panel speaker that employs a piezoelectric actuator, it is known that conductance and susceptance increase as the frequency of the input signal rises. FIG. 11 is a graph illustrating an example of the frequency characteristics of conductance and susceptance of a capacitive speaker. A curve 1 in FIG. 11 indicates the conductance characteristic of the capacitive speaker, and a curve 2 in FIG. 11 indicates the susceptance characteristic of the capacitive speaker.

In an audio circuit for driving a capacitive speaker, therefore, it is necessary to supply a current that is large in comparison with signal components having a high frequency (referred to as "high-frequency components" below) within the frequency band of a signal (referred to as an "audio signal" below) corresponding to voice or music to be reproduced. For this reason, an increase in power consumption is a problem in an audio circuit for driving a capacitive speaker, in a capacitive speaker system having this audio circuit and capacitive speaker, and in an electronic apparatus having this capacitive speaker system. Further, driving a capacitive speaker based upon an audio signal that contains many high-frequency components also invites a decline in the efficiency of the drive amplifier and the destruction thereof.

Accordingly, in a conventional audio circuit, input of high-frequency components to a capacitive speaker is attenuated by providing a drive amplifier that drives the capacitive speaker or the input side of the drive amplifier with a low-pass filter or band-pass filter formed using passive elements such as a capacitor, resistor and coil and active elements such as transistors.

Figure 12:
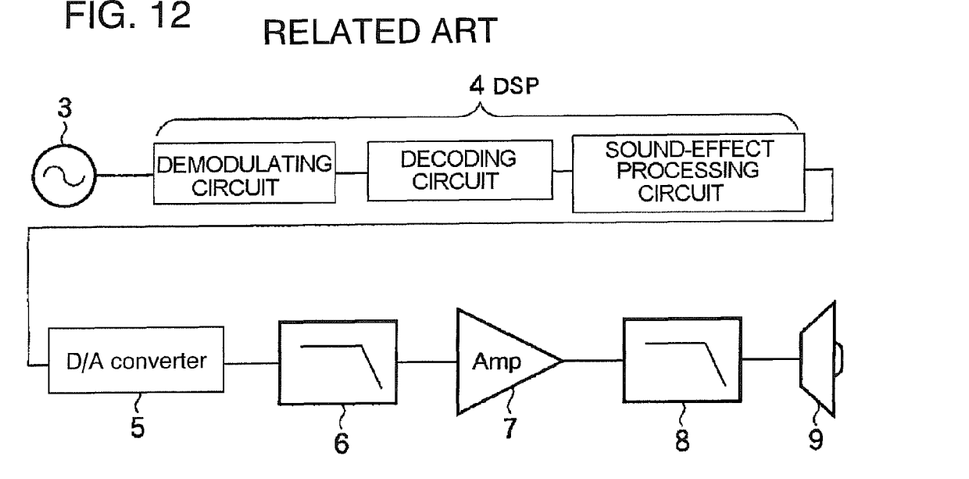
FIG. 12 is a block diagram illustrating the configuration of a conventional audio circuit.

FIG. 12 is a block diagram illustrating the configuration of a conventional audio circuit.

As illustrated in FIG. 12, the conventional audio circuit comprises a signal generating source 3 for reading an audio signal from a recording medium or the like; a DSP (Digital Signal Processor) 4 for applying processing to the audio signal that has been output from the signal generating source 3, the DSP including a demodulating circuit and a decoding circuit as well as various sound-effect processing circuits that operate as an equalizer and as limiter, etc., for compressing the audio signal to within a fixed level; a D/A converter 5 for converting the output signal of the DSP 4, which is a digital signal, to an analog signal; a first filter 6 for attenuating high-frequency components of the audio signal that has been output from the D/A converter 5; a drive amplifier 7, which includes a preamplifier, etc., for driving a capacitive speaker based upon the output signal of the first filter 6; a second filter 8 for attenuating high-frequency components or blocking high-frequency noise in the signal that has been output from the drive amplifier 7; and a capacitive speaker 9 for reproducing voice or music, etc., based upon the signal supplied from the second filter 8. A low-pass filter or band-pass filter is used as the first filter 6 and second filter 8.

It should be noted that circuits for driving a capacitive speaker (piezoelectric speaker) are described also in Patent Document 1 and Patent Document 2, by way of example.
[Patent Document 1]
  Japanese Patent Kokai Publication No. JP-A-59-146296
[Patent Document 2]
  Japanese Patent Kokai Publication No. JP-P2002-369290A

DISCLOSURE OF THE INVENTION

Problems to be Solved by the Invention

The disclosures of the above-mentioned patent documents are incorporated herein by reference thereto. The present invention offers an analysis on the prior art, as set forth below.

In a case where the cut-off frequency or amount of attenuation of high-frequency components exhibited by the low-pass filter or band-pass filter (first filter) provided on the input side of the drive amplifier is decided in the conventional audio circuit described above, the circuit is designed assuming that a case where an audio-tone signal is input is the worst-case condition.

When the circuit is designed under such a requirement, however, the amount of attenuation or the cut-off frequency of the low-pass filter or band-pass filter acts upon an ordinary audio signal excessively. This impedes faithful reproduction of high-pitched tones.

Figure 13:
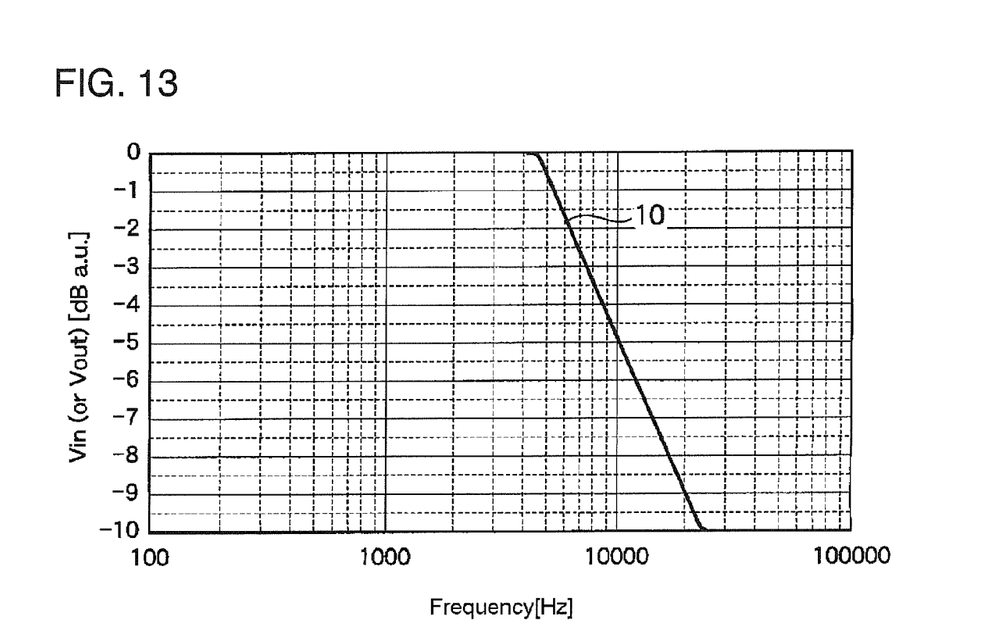
FIG. 13 is a graph illustrating an example of the frequency characteristic of maximum allowable value of an input signal.

For example, in view of the specifications of a capacitive speaker and drive amplifier thereof, if the circuit has a frequency characteristic in which the maximum allowable value of the input signal is indicated as indicated at 10 in FIG. 13, it is required that the first filter 6 be designed so as to have a cut-off frequency of 1 kHz and an amount of attenuation of −12 dB with respect to an audio-tone signal of 10 kHz. It should be noted that the vertical axis in FIG. 13 indicates the voltage of the audio signal in the form of normalized voltage values (in which the units of normalized voltage values will be represented by dB below).

Figure 14:
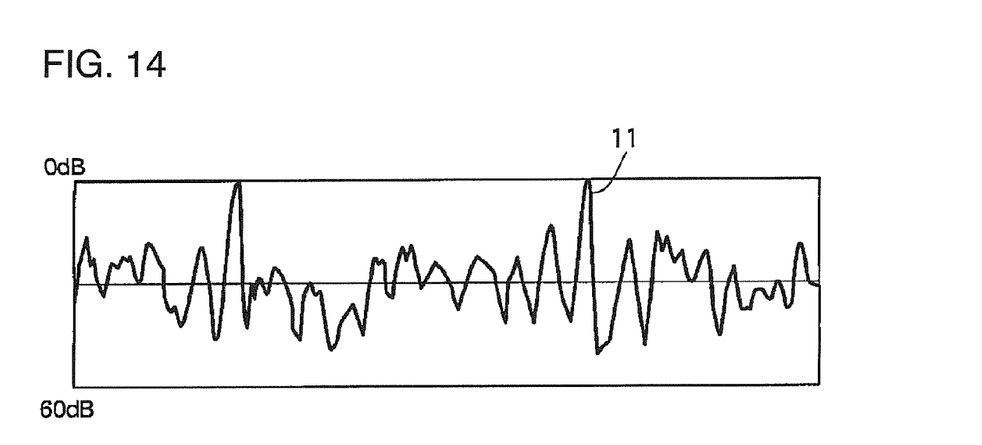
FIG. 14 is a waveform diagram illustrating an example of a standard audio signal.

On the other hand, the audio signal is limited by the limiter function, etc., with which the DSP shown in FIG. 12 is equipped, in such a manner that the maximum amplitude value will be below 0 dB in terms of the normalized voltage value, as indicated for example by curve 11 in FIG. 14. Further, the audio signal is such that its signal amplitude generally declines as frequency rises, as indicated by curve 12 in FIG. 15.

For such a standard audio signal, there is no need for a filter having the above-mentioned cut-off frequency of 1 kH and the amount of attenuation of −12 dB at 10 kHz. If such a filter is inserted, high-frequency components are greatly attenuated and the sound quality of high-pitched tones is degraded, as indicated by curve 13 in FIG. 15.

The present invention has been devised in order to solve these problems of the prior art described above and its object is to provide an audio circuit in which flow of excessive current through a capacitive speaker and drive circuit thereof can be prevented while degradation of sound quality of high-pitched tones is suppressed.

Means to Solve the Problems

In order to attain the foregoing object, an audio circuit according to the present invention has the following features: Specifically, in a first aspect, an audio circuit for driving a capacitive speaker comprises: a drive amplifier for supplying power corresponding to a signal reproduced by the capacitive speaker; a weighting circuit for weighting a signal, which is input to the drive amplifier, in conformity with frequency components of the signal, and outputting the weighted signal; and a signal-voltage limiting compression circuit for compressing the signal, which is input to the drive amplifier, at a prescribed compression ratio in accordance with a difference voltage between the output signal of the weighting circuit and a preset threshold voltage when the output signal of the weighting circuit exceeds the threshold voltage.

Alternatively, in a second aspect, an audio circuit for driving a capacitive speaker comprises: a drive amplifier for supplying power corresponding to a signal reproduced by the capacitive speaker; a weighting circuit for weighting a signal, which is output from the drive amplifier, in conformity with frequency components of the signal, and outputting the weighted signal; and a signal-voltage limiting compression circuit for compressing the signal, which has been output from the drive amplifier, at a prescribed compression ratio in accordance with a difference voltage between the output signal of the weighting circuit and a preset threshold voltage when the output signal of the weighting circuit exceeds the threshold voltage.

In the first and second aspects, the signal-voltage limiting compression circuit is capable of operating as a limiter, compressor or de-esser.

Alternatively, in a third aspect, an audio circuit for driving a capacitive speaker comprises: a drive amplifier for supplying power corresponding to a signal reproduced by the capacitive speaker; and a signal-voltage limiting compression circuit for passing, with amplitudes unchanged, signal components below a prescribed frequency contained in the signal reproduced by the capacitive speaker and compressing amplitudes of signal components equal to or greater than the prescribed frequency at a prescribed compression ratio.

In the third aspect, the audio circuit has a first weighting circuit for applying weighting conforming to frequency components of the signal reproduced by the capacitive speaker and supplying the weighted signal to the signal-voltage limiting compression circuit; and a second weighting circuit for applying weighting, which has a characteristic that is the reverse of that of the first weighting circuit, to an output of the signal-voltage limiting compression circuit and supplying the weighted signal to the drive amplifier.

In a fourth aspect, there are provided a capacitive speaker system having a capacitive speaker and the above-described audio circuit, or an audio circuit.

With the audio circuit constructed as set forth above, even if a signal containing many high-frequency components is input thereto, the signal amplitudes of the high-frequency components can be compressed at a prescribed compression ratio by the signal-voltage limiting compression circuit. As a result, an excessive current can be prevented from flowing through the capacitive speaker and its drive amplifier. Further, according to the present invention, only signal amplitudes of high-frequency components at most are compressed so as to be under a prescribed voltage, and the high-frequency components are not attenuated excessively.

EFFECT OF THE INVENTION

In accordance with the present invention, an excessive current can be prevented from flowing through a capacitive speaker and its drive amplifier. Further, since high-frequency components are not attenuated excessively, degradation of sound quality of high-pitched tones can be minimized.

EXPLANATIONS OF SYMBOLS 3 signal generating source
DSP (Digital Signal Processor)
D/A converter
6 first filter
7 drive amplifier
8 second filter
9 capacitive speaker
14 weighting circuit
15, 21 signal-voltage limiting compression circuit
22 first weighting circuit
23 second weighting circuit

PREFERRED MODES FOR CARRYING OUT THE INVENTION

Next, embodiments of the present invention will be described with reference to the drawings.

First Exemplary Embodiment

Figure 1:
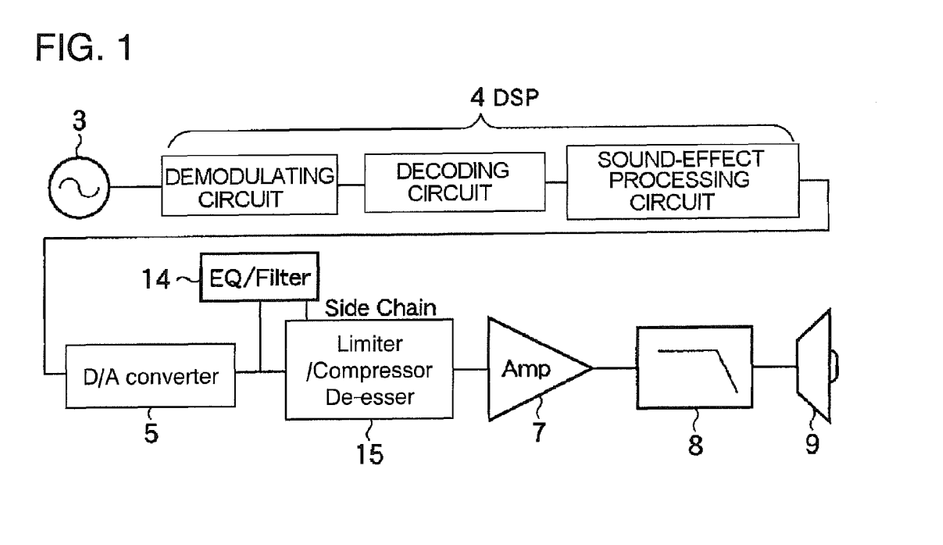
FIG. 1 is a block diagram illustrating the configuration of a first exemplary embodiment of an audio circuit according to the present invention.

FIG. 1 is a block diagram illustrating the configuration of a first exemplary embodiment of an audio circuit according to the present invention.

As illustrated in FIG. 1, the audio circuit according to the first exemplary embodiment has a configuration wherein the first filter 6, which is provided in the conventional audio circuit of FIG. 12 and is disposed on the input side of the drive amplifier 7 for supplying power conforming to the signal reproduced by the capacitive speaker, is replaced with a signal-voltage limiting compression circuit 15 having an input terminal (generally referred to as a "side chain") for signal reference, and a weighting circuit 14 for applying weighting that emphasizes the high-frequency components of the input signal and supplying the weighted signal to the side-chain terminal of the signal-voltage limiting compression circuit 15.

As will be described later, the signal-voltage limiting compression circuit 15 is capable of being operated as a limiter for completely compressing signal amplitudes to below a prescribed threshold voltage irrespective of frequency components, as a compressor for compressing signal amplitudes at a prescribed compression ratio, or as a de-esser for compressing only high-frequency components of the input signal. Further, an equalizer or filter, etc., is used as the weighting circuit 14. Since other circuit components are similar to those of the conventional audio circuit shown in FIG. 12, a description thereof is omitted. It should be noted that reference characters identical with those shown in FIG. 12 are assigned to a signal generating source, DSP, D/A converter, drive amplifier, second filter and capacitive speaker in FIG. 1 that are similar to those of the conventional arrangement.

As illustrated in FIG. 1, the audio circuit of the first exemplary embodiment is such that the signal that has been output from the D/A converter 5 is branched in two directions so that one signal is input to the signal-voltage limiting compression circuit 15 and the other is input to the weighting circuit 14. The weighting circuit 14 applies weighting that conforms to the frequency of the input signal and inputs the weighted signal (referred to as a "side-chain input signal" below) to the side-chain input terminal of the signal-voltage limiting compression circuit 15. On the basis of the side-chain signal, the signal-voltage limiting compression circuit 15 compresses the amplitude of the signal that has entered from the signal terminal and outputs the resultant signal to the drive amplifier 7.

Figure 2:
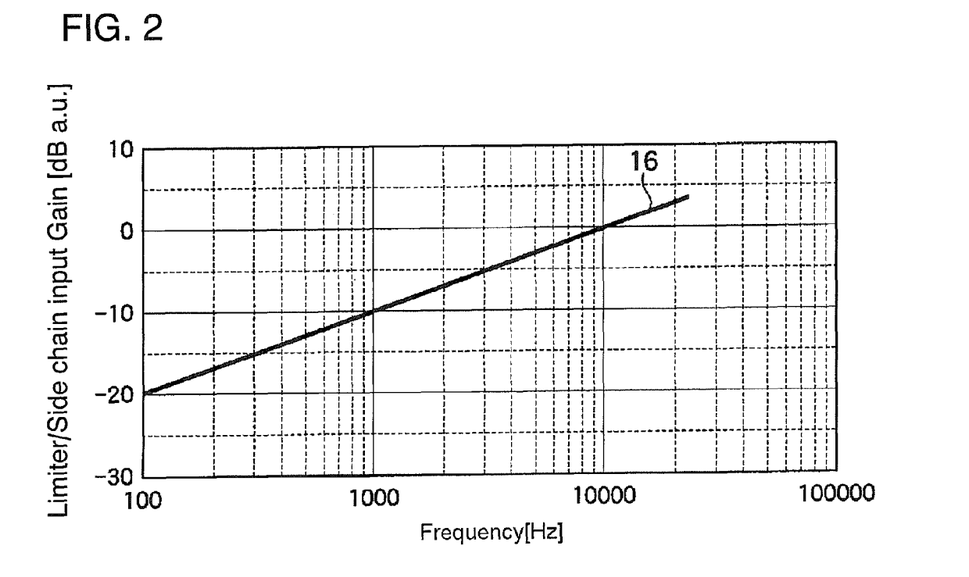
FIG. 2 is a graph illustrating an example of processing by a weighting circuit shown in FIG. 1.

The weighting circuit 14 subjects the signal that has been output from the D/A converter 5 to weighting such that the higher the frequency, the more the signal voltage is emphasized, as illustrated in FIG. 2 by way of example. In the example shown in FIG. 2, within a range of frequencies from 10 Hz to 20 kHz, the signal voltage is enlarged at a slope of 3 dB/oct as frequency rises. The weighting circuit 14 can be implemented in simple fashion by signal processing using a DSP, etc., or by a circuit that employs passive elements or active elements such as transistors.

Figure 3:
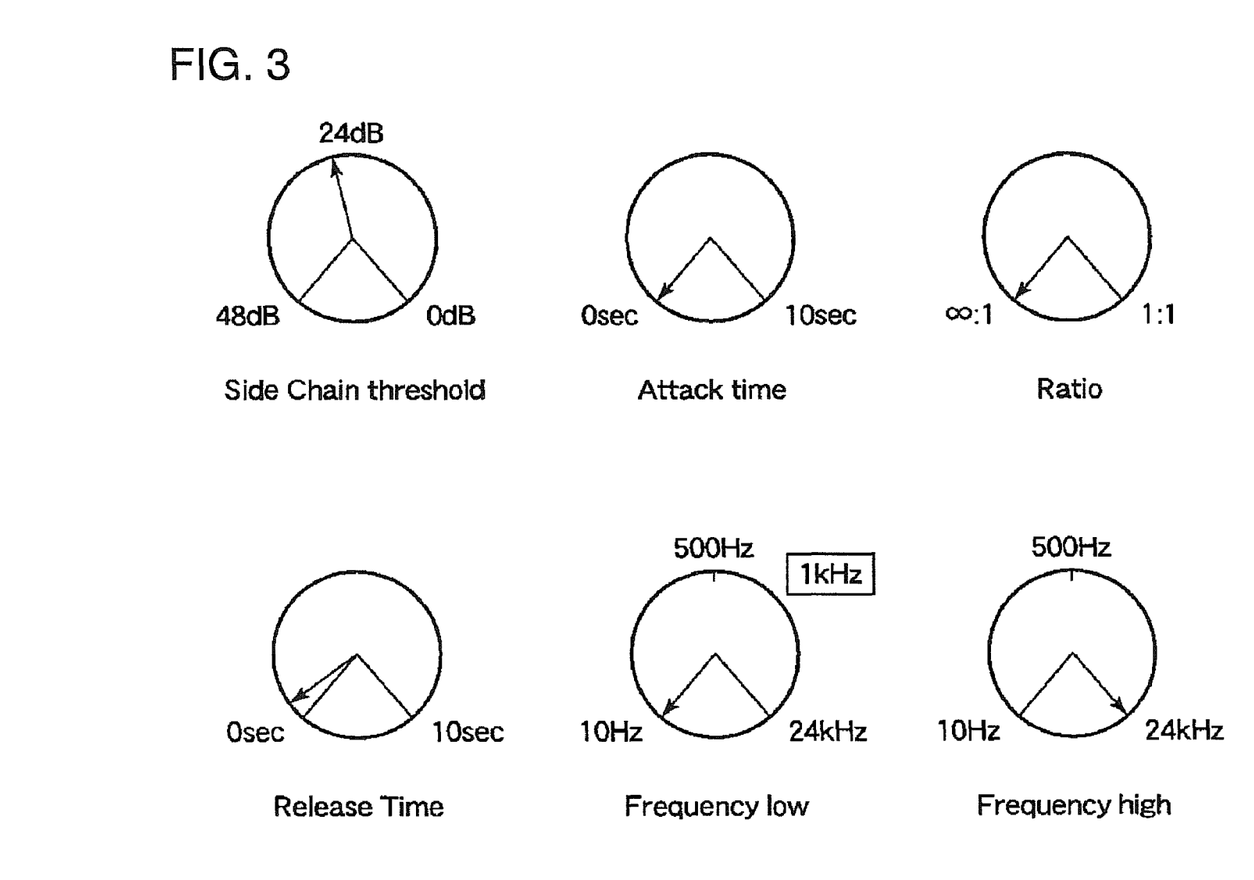
FIG. 3 is a schematic view illustrating an example of settings of parameters of a signal-voltage limiting compression circuit shown in FIG. 1.

Further, as shown for example in FIG. 3, the signal-voltage limiting compression circuit 15 is operated as a limiter in which attack time and release time are set to be as short as possible within limits in which amplitude compression will not be applied too strongly; the compression ratio is set to infinity: 1; and the band compressed is set in such a manner that the entire reproduction band (10 Hz to 24 kHz) is completely compressed to below the threshold voltage.

Operation of the audio circuit shown in FIG. 1 will be described next.

In a case where the side-chain input signal has been amplified at the slope of 3 dB/oct so that the output signal of the D/A converter is as indicated by the equation below, the side-chain input signal that is applied to the signal-voltage limiting compression circuit 15 takes on the characteristic 16 illustrated in FIG. 2.

$$Vin\_sc = Vout\_da + 2^{n/N} - 30 \qquad \text{Equation (1)}$$

Here Vin_sc represents the voltage of the side-chain input signal, Vout_da the voltage of the output signal from the D/A converter, N the number of octave divisions and n the number assigned in regular order to each frequency band obtained by division. In this example, the entire reproduction band is attenuated uniformly to 30 dB in order to prevent excessive input of the audio signal to the side-chain terminal.

Figure 4:
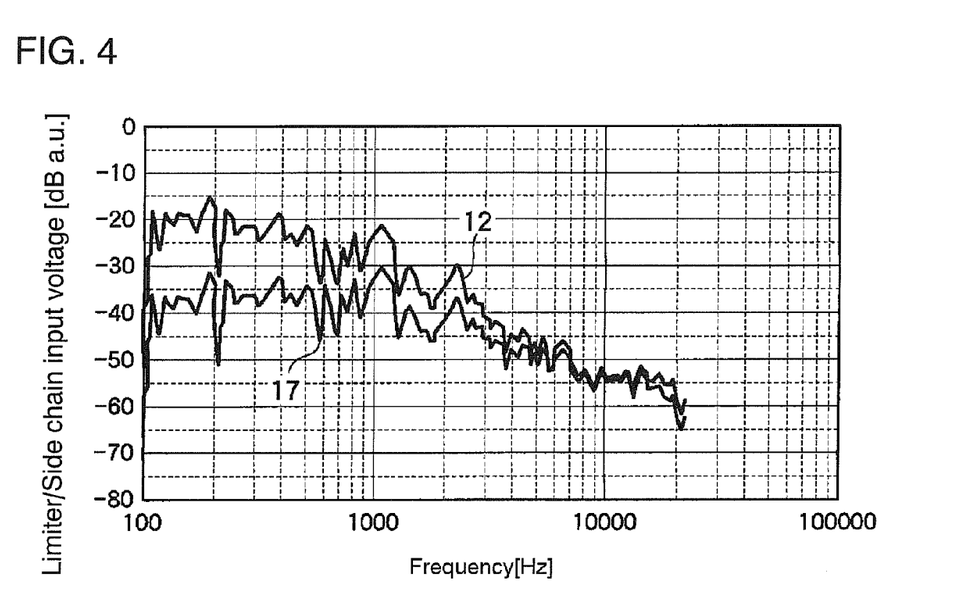
FIG. 4 is a graph illustrating an example of frequency characteristics of an input signal and side-chain input signal applied to the signal-voltage limiting compression circuit shown in FIG. 1.
Figure 15:
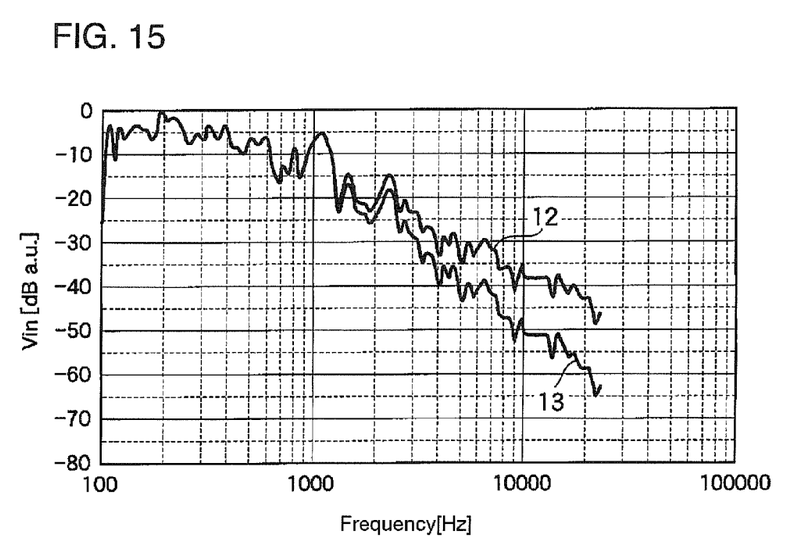
FIG. 15 is a graph illustrating an example of the frequency characteristic of a standard audio signal.

In a case where an audio signal having the characteristic 12 of FIG. 15, for example, has been input to the audio circuit having this signal-voltage limiting compression circuit 15, a signal in which the high-frequency region has been emphasized as indicated at 17 in FIG. 4 is input to the side-chain terminal. It should be noted that the normalized voltage value of the audio signal having the characteristic 12 of FIG. 15 is 0 dB when it is expressed by an inverse Fourier transform as a change in amplitude in the time domain. The input voltage to the side-chain terminal is −23 dB.

If the threshold voltage at which the signal-voltage limiting compression circuit 15 starts signal-voltage limiting compression is made −20 dB, the audio signal having the characteristic 12 shown in FIG. 15 will be below the threshold voltage and is therefore passed without being compressed.

Figure 5:
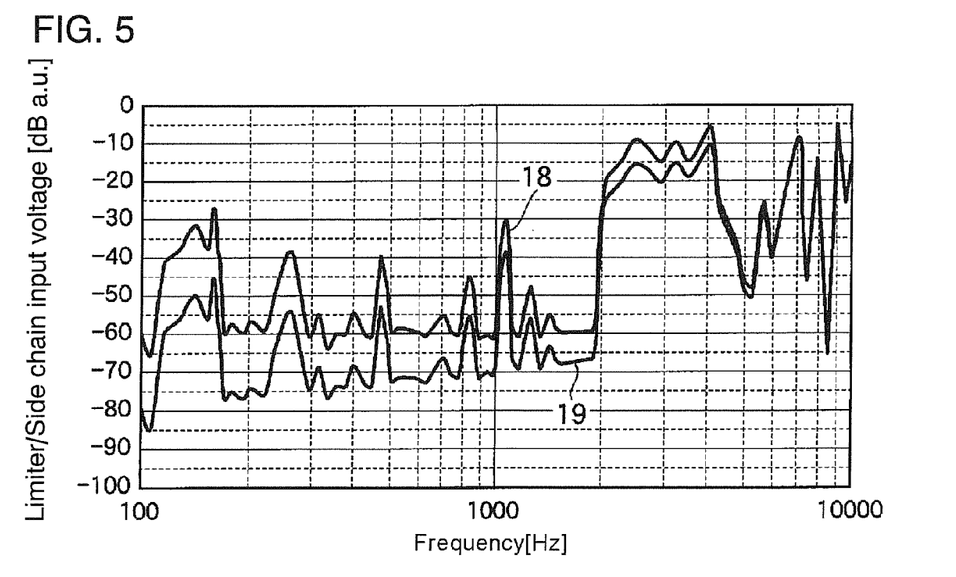
FIG. 5 is a graph illustrating another example of frequency characteristics of an input signal and side-chain input signal applied to the signal-voltage limiting compression circuit shown in FIG. 1.
Figure 6:
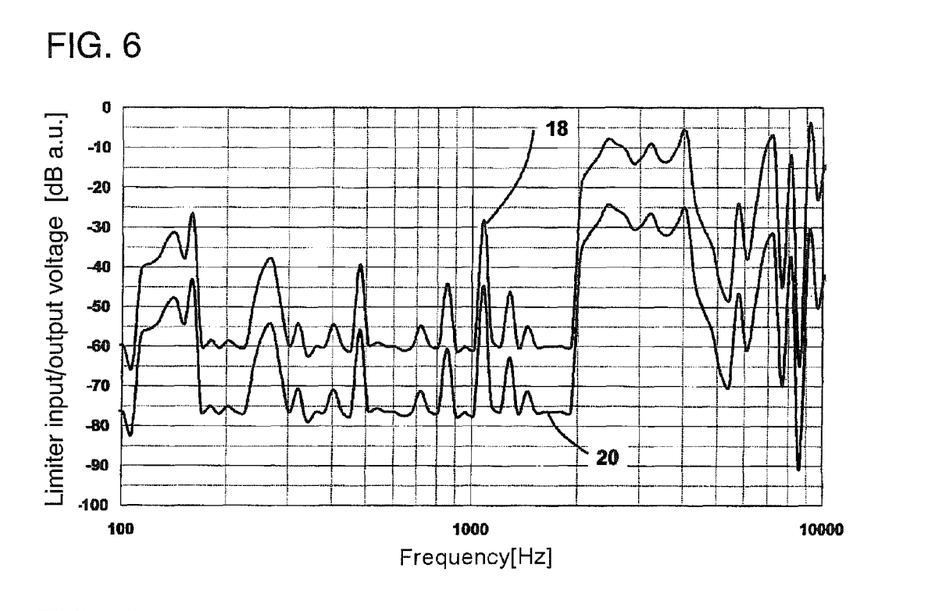
FIG. 6 is a graph illustrating the frequency characteristic of an output signal when the signals shown in FIG. 5 have been input to the signal-voltage limiting compression circuit shown in FIG. 1.

On the other hand, in a case where an audio signal containing many high-frequency components as indicated by characteristic 18 in FIG. 5 has been input (the normalized voltage value of this signal also is approximately 0 dB), the frequency characteristic of the side-chain input signal becomes as indicated by characteristic 19 in FIG. 5 and the input voltage to the side-chain terminal becomes −3.5 dB. Since the audio signal having the characteristic 18 in FIG. 5 exceeds the threshold voltage (−20 dB), the amplitudes of all frequency components are compressed by 16.5 dB, which is the difference between these voltages. In this case, the frequency characteristic of the signal that is output from the signal-voltage limiting compression circuit 15 is as indicated by characteristic 20 in FIG. 6.

By virtue of the processing described above, the input voltage to the drive amplifier 7 is compressed to within allowable values in the entire reproduction band, and the total of the drive currents of the capacitive speaker 9 corresponding to all frequency components is compressed so as not to exceed a desired current.

It should be noted that in the description rendered above, the illustrated example is one in which the signal-voltage limiting compression circuit 15 operates as a limiter that compresses all frequency components (10 Hz to 24 kHz) of the reproduction band to below the threshold voltage across the board. However, by changing the weighting characteristic of the side-chain input signal or various parameters such as ratio and threshold etc., it is possible for the signal-voltage limiting compression circuit 15 to be operated as the above-mentioned compressor or de-esser.

By way of example, if the threshold voltage is set to approximately −30 dB, attack time and release time are lengthened on the order of one second and the compression ratio is lowered to 4:1, then the signal-voltage limiting compression circuit 15 operates as a compressor. Further, if the frequency band to undergo compression is set to 4 kHz to 24 kHz and the setup is such that only high-frequency components are compressed, then the signal-voltage limiting compression circuit 15 operates as a de-esser.

Furthermore, in the description rendered above, an example in which the weighting circuit 14 and signal-voltage limiting compression circuit 15 are provided on the output side of the D/A converter 5 is illustrated. However, the functions of the weighting circuit 14 and signal-voltage limiting compression circuit 15 may just as well be provided in the DSP 4 shown in FIG. 1 or within the drive amplifier 7. Further, the functions of the weighting circuit 14 and signal-voltage limiting compression circuit 15 may be provided externally independent of the audio circuit shown in FIG. 6.

In accordance with the audio circuit of this exemplary embodiment, even if an audio signal containing many high-frequency components has been input, the signal amplitudes are compressed to below a desired threshold value by the signal-voltage limiting compression circuit 15, and therefore an excessive current can be prevented from flowing through the capacitive speaker 9 and its drive amplifier 7. Further, by applying weighting conforming to the frequency components of the audio signal using the weighting circuit 14, the high-frequency components are not attenuated excessively and, hence, a degradation in sound quality of reproduced high-pitch tones can be held to the minimum.

Second Exemplary Embodiment

Figure 7:
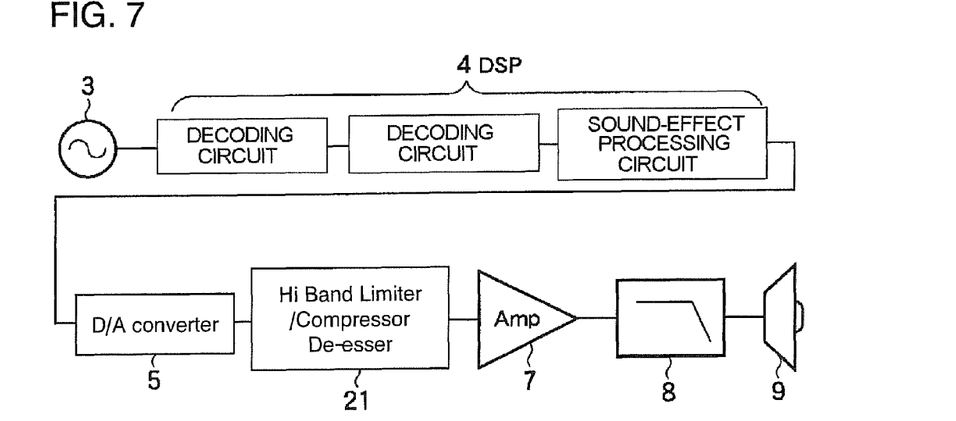
FIG. 7 is a block diagram illustrating the configuration of a second exemplary embodiment of an audio circuit according to the present invention.
Figure 8:
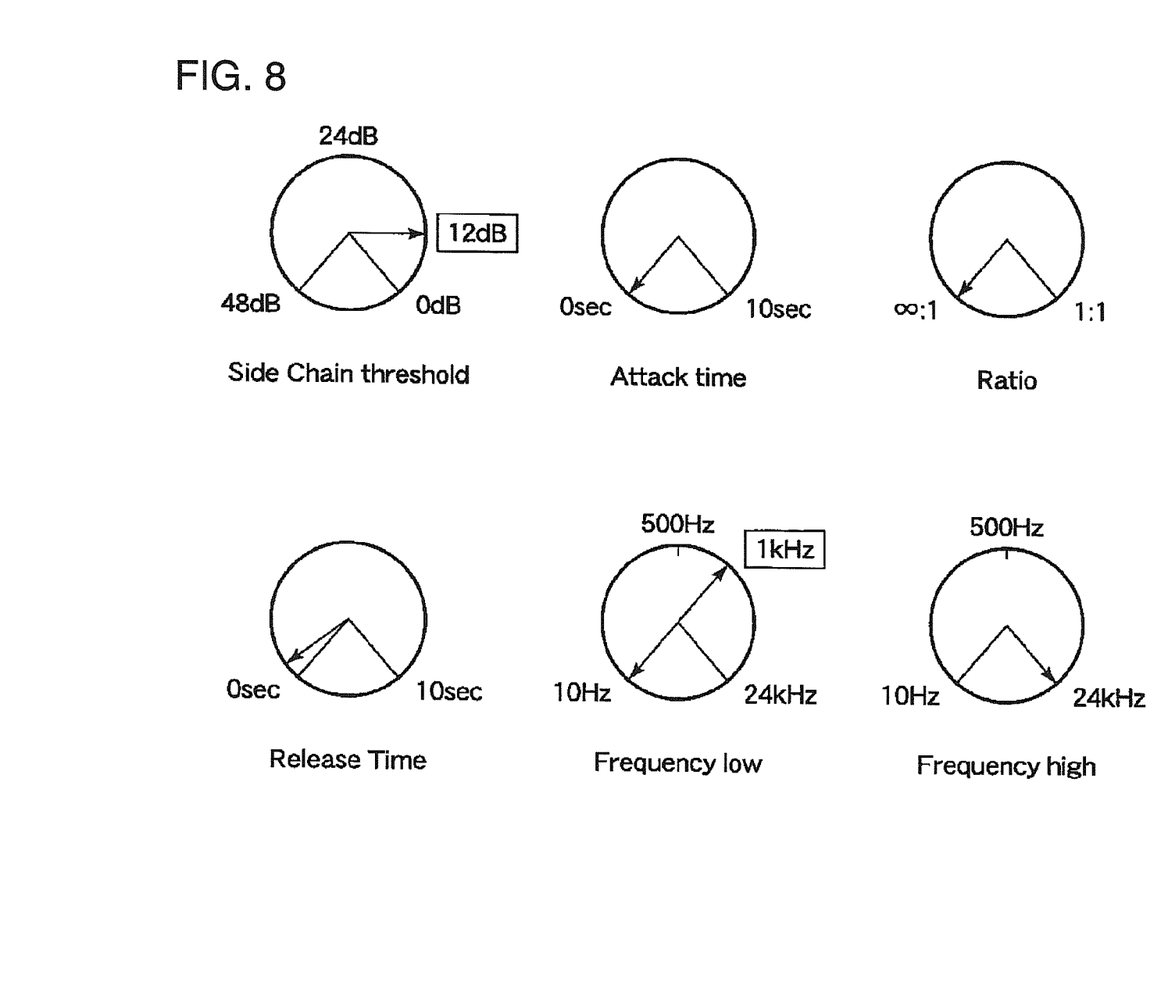
FIG. 8 is a schematic view illustrating an example of settings of parameters of a signal-voltage limiting compression circuit shown in FIG. 7.

FIG. 7 is a block diagram illustrating the configuration of a second exemplary embodiment of an audio circuit according to the present invention.

The audio circuit of the second exemplary embodiment is such that the weighting circuit illustrated in the first exemplary embodiment is eliminated and the configuration of the signal-voltage limiting compression circuit differs from that of the audio circuit of the first exemplary embodiment. Since other structural elements are similar to those of the first exemplary embodiment, a description thereof is omitted. It should be noted that reference characters identical with those shown in FIG. 12 are assigned to a signal generating source, DSP, D/A converter, drive amplifier, second filter and capacitive speaker in FIG. 7 that are similar to those of the conventional arrangement.

In the second exemplary embodiment, the arrangement is one in which the entire band of the audio signal is divided at a prescribed band width into a plurality of bands and only a single signal-voltage limiting compression circuit 21 for compressing signal amplitude is provided for dealing with high-frequency components only, or one in which a plurality of signal-voltage limiting compression circuits 21 having different weighting characteristics are provided for respective ones of the bands obtained by division.

The signal-voltage limiting compression circuit 21 with which the audio circuit of the second exemplary embodiment is equipped is internally provided with a band-pass filter for band division for passing only signal components having a prescribed bandwidth, compresses only the amplitudes of signal components within the set band at a prescribed compression ratio and passes signal components in bands other than this band.

For example, in the case where only one signal-voltage limiting compression circuit for compressing signal amplitude is provided solely for high-frequency components, if the divided band is set to 1 kHz to 24 kHz and the threshold voltage is set to −12 dB, which is the boundary value of input voltage at 10 kHz, based upon the characteristic 10 shown in FIG. 13, the drive amplifier 7 can be protected from excessive currents even in a case where an audio-tone signal of 1 kHz to 10 kHz has been input.

If an audio signal containing many high-frequency components has been input to the audio circuit of the second exemplary embodiment, then, in a manner similar to the first exemplary embodiment, signal amplitudes are compressed to below the desired threshold value by the signal-voltage limiting compression circuit 21, and therefore an excessive current can be prevented from flowing through the capacitive speaker 9 and its drive amplifier 7. Further, by applying weighting in conformity with the frequency components, high-frequency components are not attenuated excessively. As a result, a degradation in sound quality of reproduced high-pitch tones can be suppressed to the minimum.

Third Exemplary Embodiment

Figure 9:
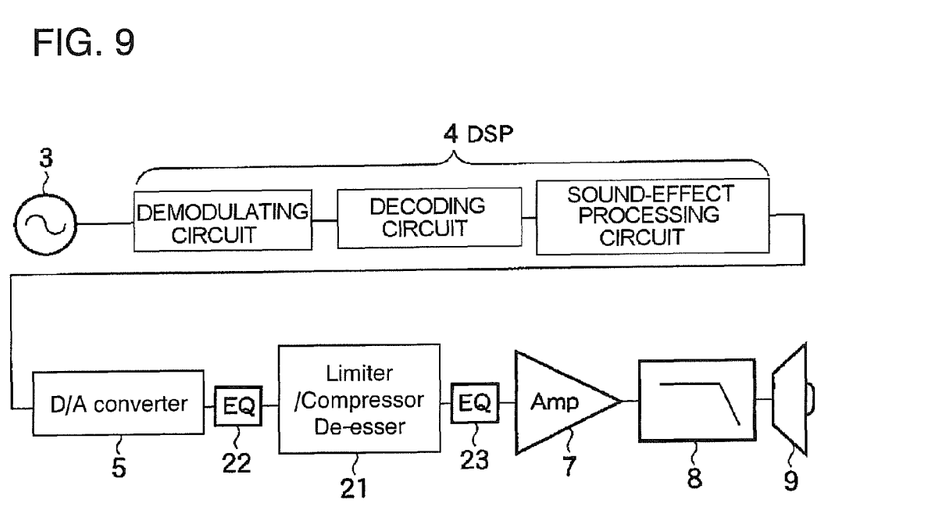
FIG. 9 is a block diagram illustrating the configuration of a third exemplary embodiment of an audio circuit according to the present invention.

FIG. 9 is a block diagram illustrating the configuration of a third exemplary embodiment of an audio circuit according to the present invention.

The audio circuit of the third exemplary embodiment is equipped with the signal-voltage limiting compression circuit 21 shown in the second exemplary embodiment illustrated in FIG. 7, and has a first weighting circuit 22 and a second weighting circuit 23 on the input and output sides, respectively, of the signal-voltage limiting compression circuit 21. The first weighting circuit 22 and second weighting circuit 23 employ an equalizer or filter. Since other structural elements are similar to those of the first exemplary embodiment, a description thereof is omitted. It should be noted that reference characters identical with those shown in FIG. 12 are assigned to a signal generating source, DSP, D/A converter, drive amplifier, second filter and capacitive speaker in FIG. 9 that are similar to those of the conventional arrangement.

In the audio circuit of the third exemplary embodiment, weighting of frequency components of the input signal is performed by the first weighting circuit 22 as shown for example in FIG. 2, and the weighted signal is output. The signal-voltage limiting compression circuit 21 compresses the amplitude of the signal that has been output from the first weighting circuit 22. The second weighting circuit 23 subjects the signal that has been output from the signal-voltage limiting compression circuit 21 to weighting of each of the frequency components using a characteristic that is the reverse of that of the first weighting circuit 22, and outputs the weighted signal.

In this arrangement also, if an audio signal containing many high-frequency components has been input, then, in a manner similar to the first exemplary embodiment, signal amplitudes are compressed to below the desired threshold value by the signal-voltage limiting compression circuit 21, and therefore an excessive current can be prevented from flowing through the capacitive speaker 9 and its drive amplifier 7. Further, by applying weighting in conformity with the frequency components, high-frequency components are not attenuated excessively. As a result, a degradation in sound quality of reproduced high-pitch tones can be suppressed to the minimum.

Fourth Exemplary Embodiment

Figure 10:
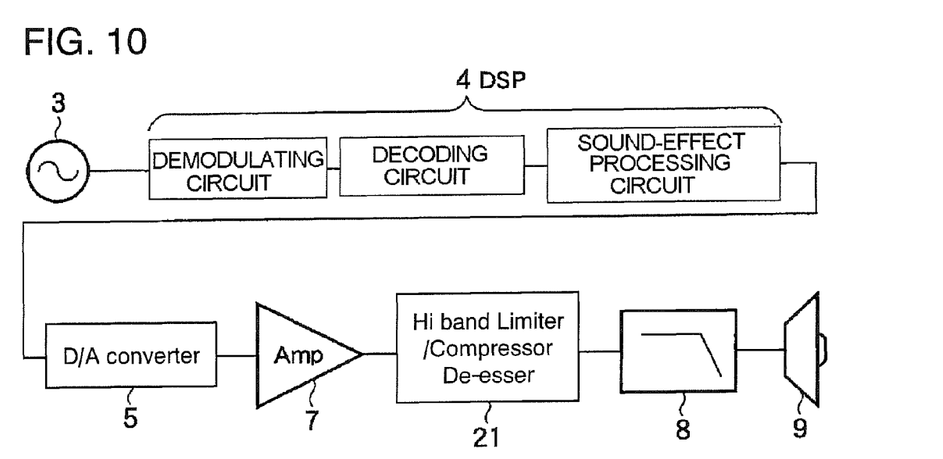
FIG. 10 is a block diagram illustrating the configuration of a fourth exemplary embodiment of an audio circuit according to the present invention.

FIG. 10 is a block diagram illustrating the configuration of a fourth exemplary embodiment of an audio circuit according to the present invention.

In the first to third embodiments set forth above, arrangements in which the signal-voltage limiting compression circuit is provided on the input side of the drive amplifier 7 are illustrated. As illustrated in FIG. 10, however, the fourth exemplary embodiment has an arrangement in which the signal-voltage limiting compression circuit 21 is provided on the output side of the drive amplifier 7.

Any of the arrangements illustrated in the first to third embodiments may be used for the signal-voltage limiting compression circuit (FIG. 10 illustrates an example in which the signal-voltage limiting compression circuit 21 shown in the second exemplary embodiment is used). Since other structural elements are similar to those of the first exemplary embodiment, a description thereof is omitted. It should be noted that reference characters identical with those shown in FIG. 12 are assigned to a signal generating source, DSP, D/A converter, drive amplifier, second filter and capacitive speaker in FIG. 10 that are similar to those of the conventional arrangement.

The second filter 8 for attenuating high-frequency components or blocking high-frequency noise in the signal that has been output from the drive amplifier 7 shown in FIG. 10 has the function of the first filter of FIG. 12 for attenuating high-frequency components and can be adapted to compress high-frequency components by making joint use of the signal-voltage limiting compression circuit 15.

If an audio signal containing many high-frequency components has been input to the audio circuit of the fourth exemplary embodiment, then, in a manner similar to the first exemplary embodiment, signal amplitudes are compressed to below the desired threshold value by the signal-voltage limiting compression circuit, and therefore an excessive current can be prevented from flowing through the capacitive speaker 9 and its drive amplifier 7. Further, by applying weighting in conformity with the frequency components, high-frequency components are not attenuated excessively. As a result, a degradation in sound quality of reproduced high-pitch tones can be suppressed to the minimum.

Fifth Exemplary Embodiment

Figure 16:
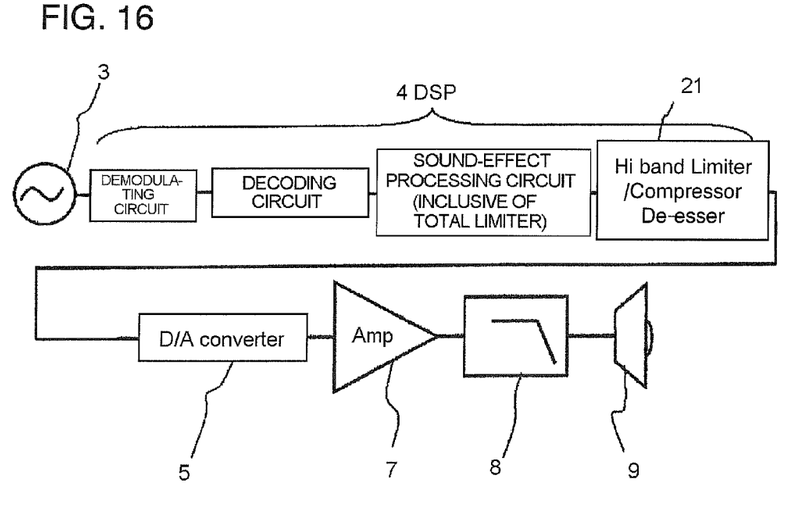
FIG. 16 is a block diagram illustrating the configuration of a fifth exemplary embodiment of an audio circuit according to the present invention.

FIG. 16 is a block diagram illustrating the configuration of a fourth exemplary embodiment of an audio circuit according to the present invention.

In the first to fourth embodiments set forth above, arrangements in which the signal-voltage limiting compression circuit is provided downstream of the D/A converter 5 are illustrated. As illustrated in FIG. 16, however, the fifth exemplary embodiment has an arrangement in which the signal-voltage limiting compression circuit 21 is provided within the DSP on the upstream side of the D/A converter.

The advantage of the fifth exemplary embodiment is that effects similar to those of the first to fourth embodiments are obtained by signal processing, which is performed by software within the DSP, without providing independent hardware circuits.

Any of the arrangements illustrated in the first to third embodiments may be used for the signal-voltage limiting compression circuit 21 (FIG. 16 illustrates an example in which the signal-voltage limiting compression circuit 21 shown in the second and third embodiments is used). Since other structural elements are similar to those of the first exemplary embodiment, a description thereof is omitted. It should be noted that reference characters identical with those shown in FIG. 12 are assigned to a signal generating source, DSP, D/A converter, drive amplifier, second filter and capacitive speaker in FIG. 16 that are similar to those of the conventional arrangement.

The second filter 8 for attenuating high-frequency components or blocking high-frequency noise in the signal that has been output from the drive amplifier 7 shown in FIG. 16 has the function of the first filter of FIG. 12 for attenuating high-frequency components and can be adapted to compress high-frequency components by making joint use of the signal-voltage limiting compression circuit 21.

If an audio signal containing many high-frequency components has been input to the audio circuit of the fifth exemplary embodiment, then, in a manner similar to the first exemplary embodiment, signal amplitudes are compressed to below the desired threshold value by the signal-voltage limiting compression circuit, and therefore an excessive current can be prevented from flowing through the capacitive speaker 9 and its drive amplifier 7. Further, by applying weighting in conformity with the frequency components, high-frequency components are not attenuated excessively. As a result, a degradation in sound quality of reproduced high-pitch tones can be suppressed to the minimum.

Within the entire disclosure (including claims), variations and modifications of/from the exemplary embodiments or examples are possible based on the basic technical concept. Also various combinations or selections of the disclosed various elements are possible within the claimed scopes of the present invention.

What is claimed is:

1. An audio circuit for driving a capacitive speaker, comprising:
   a drive amplifier that supplies power corresponding to a signal reproduced by said capacitive speaker;
   a weighting circuit that weights a signal at upstream of said drive amplifier, in conformity with frequency components of said signal, and outputs the weighted signal; and
   a signal-voltage limiting compression circuit that compresses the signal, which is to be supplied to said drive amplifier, at a prescribed compression ratio in accordance with a difference voltage between the output signal of said weighting circuit and a preset threshold voltage when the output signal of said weighting circuit exceeds the threshold voltage.

2. An audio circuit according to claim 1, wherein said signal-voltage limiting compression circuit operates as a limiter.

3. An audio circuit according to claim 1, wherein said signal-voltage limiting compression circuit operates as a compressor.

4. An audio circuit according to claim 1, wherein said signal-voltage limiting compression circuit operates as a de-esser.

5. A capacitive speaker system comprising:
   a capacitive speaker; and
   the audio circuit set forth in claim 1.

6. The audio circuit according to claim 1, wherein said weighting circuit performs weighting in conformity with frequency bands including at least a high frequency component and a remaining component(s).

7. An audio circuit for driving a capacitive speaker, comprising:
   a drive amplifier that supplying supplies power corresponding to a signal reproduced by said capacitive speaker;
   a weighting circuit that weights a signal at downstream of said drive amplifier, in conformity with frequency components of said signal, and outputs the weighted signal; and
   a signal-voltage limiting compression circuit for compressing the signal, which is a signal downstream of said drive amplifier, at a prescribed compression ratio in accordance with a difference voltage between the output signal of said weighting circuit and a preset threshold voltage when the output signal of said weighting circuit exceeds the threshold voltage.

8. An audio circuit according to claim 7, wherein said signal-voltage limiting compression circuit operates as a limiter.

9. An audio circuit according to claim 7, wherein said signal-voltage limiting compression circuit operates as a compressor.

10. An audio circuit according to claim 7, wherein said signal-voltage limiting compression circuit operates as a de-esser.

11. A capacitive speaker system comprising:
a capacitive speaker; and
the audio circuit set forth in claim 7.

12. The audio circuit according to claim 7, wherein said weighting circuit performs weighting in conformity with frequency bands including at least a high frequency component and a remaining component(s).

13. An audio circuit for driving a capacitive speaker, comprising:
a drive amplifier that supplies power corresponding to a signal reproduced by said capacitive speaker; and
a signal-voltage limiting compression circuit that passes, with amplitudes unchanged, signal components below a prescribed frequency contained in the signal reproduced by said capacitive speaker, and compresses amplitudes of signal components equal to or greater than said prescribed frequency at a prescribed compression ratio.

14. An audio circuit according to claim 13, further comprising:
a first weighting circuit that applies weighting conforming to frequency components of the signal reproduced by said capacitive speaker, and supplies the weighted signal to said signal-voltage limiting compression circuit; and
a second weighting circuit that applies weighting, which has a characteristic that is the reverse of that of said first weighting circuit, to an output signal of said signal-voltage limiting compression circuit, and supplies the weighted signal to said drive amplifier.

15. An electronic apparatus comprising:
a capacitive speaker; and
the audio circuit set forth in claim 13.

16. The audio circuit according to claim 13, wherein said signal-voltage limiting compression circuit operates as a high-band limiter/compressor acting as a de-esser at upstream of said drive amplifier.

17. The audio circuit according to claim 13, wherein said signal-voltage limiting compression circuit operates as a high-band limiter/compressor acting as a de-esser at downstream of said drive amplifier.

18. The audio circuit according to claim 13, wherein said signal-voltage limiting compression circuit operates as a high-band limiter/compressor acting as a de-esser at upstream of a D/A converter which is disposed upstream of said drive amplifier.

* * * * *